US007085389B1

(12) United States Patent
Modafferi

(10) Patent No.: US 7,085,389 B1
(45) Date of Patent: Aug. 1, 2006

(54) INFINITE SLOPE LOUDSPEAKER CROSSOVER FILTER

(75) Inventor: Richard T. Modafferi, Vestal, NY (US)

(73) Assignee: Modafferi Acoustical Systems, Palm Beach Gardens, FL (US)

( * ) Notice: Subject to any disclaimer, the term of this patent is extended or adjusted under 35 U.S.C. 154(b) by 106 days.

(21) Appl. No.: 10/677,160

(22) Filed: Sep. 30, 2003

(51) Int. Cl.
*H03G 3/00* (2006.01)
*H03F 21/00* (2006.01)

(52) U.S. Cl. .......................... 381/99; 381/98; 381/100; 381/120

(58) Field of Classification Search .................. 381/98, 381/99, 100, 120
See application file for complete search history.

(56) References Cited

U.S. PATENT DOCUMENTS 4,138,594 A 2/1979 Klipsch
4,237,340 A 12/1980 Klipsch
4,287,389 A 9/1981 Gamble
4,606,071 A 8/1986 White
4,771,466 A * 9/1988 Modafferi .................... 381/99
4,897,879 A 1/1990 Geluk
5,530,770 A * 6/1996 Kim ........................... 381/120
5,598,480 A 1/1997 Kim
5,937,072 A * 8/1999 Combest ...................... 381/99

* cited by examiner

*Primary Examiner*—Vivian Chin
*Assistant Examiner*—Devona E. Faulk
(74) *Attorney, Agent, or Firm*—Mark Levy & Associates, PLLC; David L. Banner

(57) ABSTRACT

An improvement to inventor's prior art loudspeaker crossover filter invention is described. A substantially flat network input-impedance characteristic across the audible frequency range is provided by the addition of at least one series connected constant resistance network at the input terminals of the crossover filter system. By relaxing certain infinite slope filter parameters, more uniform acoustic polar response of the loudspeaker system is obtained. Specifically, infinite slope methods are used for the upper (higher frequency) band-edge of low-pass and band-pass filters, and optionally, for high-pass filters. Infinite slope characteristics, however, are relaxed for the lower frequency slope of band-pass filters and, optionally, for high-pass filters. In addition, the crossover network uses fewer components than infinite slope crossovers of the prior art.

11 Claims, 15 Drawing Sheets

INFINITE SLOPE LOUDSPEAKER CROSSOVER FILTER

RELATED APPLICATIONS

This application is related to U.S. Pat. No. 4,771,466 for MULTIDRIVER LOUDSPEAKER APPARATUS WITH IMPROVED CROSSOVER FILTER CIRCUITS, issued to Richard Modafferi on Sep. 13, 1988, included by reference herein in its entirety.

FIELD OF THE INVENTION

The present invention relates to the field of loudspeaker systems and, more particularly, to a crossover network having a combination of steep and shallow slopes in its filter amplitude response and presents a constant impedance at its input.

BACKGROUND OF THE INVENTION

Modern loudspeaker systems are expected to accurately reproduce sound across the entire audible audio spectrum. No individual speaker element (i.e., driver), however, has been found that can accurately reproduce this entire range of audible frequencies. Therefore, high-fidelity loudspeaker systems are generally realized by dividing the audio frequency spectrum into two or more separate frequency bands and applying each of these bands of the audio frequency range to separate drivers. For this purpose, crossover network filters are provided. Each driver may then be optimized to best reproduce a particular range or band of frequencies. When properly combined into a loudspeaker system, such drivers and an appropriate crossover network form a loudspeaker system capable of more accurately reproducing the entire audible frequency range.

Crossover network filters belong to one of three classes: low-pass for low frequency drivers (i.e., woofers), band-pass for midrange drivers, and high-pass for high frequency (i.e., tweeters).

For perfect fidelity (i.e., accuracy of reproduction of an applied electrical signal), a loudspeaker system is assumed to realize the ideal all-pass transfer function of:

$$f(s)=Ke^{-sT} \tag{1}$$

where S is the complex frequency variable (s=•+j•), K and T are real positive constants, and e=2.718.

If $f_{(s)}$ represents the acoustic pressure in the space into which the loudspeaker system radiates sound, then Equation (1) defines the transfer function for a perfect loudspeaker system. Such a loudspeaker system has flat amplitude response and linear phase response. To the best knowledge of the present inventor, such a loudspeaker system, having the transfer function defined by Equation (1), has not yet been perfectly realized, at least in a three-dimensional acoustic space using any known method. Accordingly, loudspeaker system configurations have been based on an approximation to this ideal transfer function.

The simplest and probably best-known approximation to the ideal transfer function is illustrated by a two-way loudspeaker system having a single woofer, a single tweeter, and a simple crossover network. Such a loudspeaker system 100 is shown in FIG. 1. A woofer 102 and a tweeter 104 are interconnected by a simple, two-component crossover network 106 having a 6 dB/octave rolloff or slope. The ideal transfer function of Equation (1) may be reduced to one independent of frequency by expanding Equation (1) into a power series.

Setting K=1:

$$f(s)=e^{-sT}=\frac{1}{1+sT+\frac{(sT)^2}{2}+\Lambda} \tag{2}$$

Taking the first term of Equation 2 yields:

$$f_1(s)=\frac{1}{(1+sT)} \tag{3}$$

Equation (3) is the transfer function of a circuit having an inductor 110 of T henries in series with a 1 ohm resistor 108, (FIG. 2), which is similar to the woofer-inductor series circuit shown in FIG. 1.

Replacing s with new variable (1/sT) in Equation (1) yields, after expanding and taking the first term as before:

$$f_2(s)=\frac{1}{1+\frac{1}{sT}}=\frac{sT}{1+sT} \tag{4}$$

Equation (4) is the transfer function of a circuit having a capacitor 112 of T farads in series with a one-ohm resistor 114, (FIG. 3), which is similar to the tweeter-capacitor series circuit shown in FIG. 1.

If the resistor 108 in FIG. 2 is replaced by an ideal woofer and the resistor 114 in FIG. 3 is replaced by an ideal tweeter, the speaker system in FIG. 1 is obtained. Acoustic output (i.e., sound pressure in the acoustic space) is the sum of woofer and tweeter outputs, which is the sum of equations (2) and (3):

$$\text{Acoustic Output}=\frac{1}{1+sT}+\frac{sT}{1+sT}=1 \tag{5}$$

Since the sum in Equation (5) is unity (a constant), acoustic output becomes independent of frequency. The speaker system can be considered “perfect,” i.e., having both flat amplitude and linear phase response. While the foregoing analysis shows such a speaker system to be mathematically perfect, problems arise when constructing such a loudspeaker system. First, neither the woofer 102 nor the tweeter 104 exhibit ideal amplitude or phase response. Second, such a loudspeaker system must typically function in a three-dimensional acoustic space in which the simple energy relationship represented by Equation (5) is not valid, at least not for all points in the space.

Third, the gradual crossover filter slopes (i.e., only 6 dB/octave) represented by Equations (2) and (3) allow significant out-of-band energy to enter the drivers (woofer 102 and tweeter 104). This causes low frequency (bass) to overload the tweeter 104. When applied to the woofer 102, high frequency (treble) typically causes cone breakup. This phenomenon causes a variety of distorted sound problems well known to those skilled in the art.

Several solutions to the aforementioned problems have been proposed and/or implemented. One prior art solution was to add sections to the crossover filters. "All pole" transfer functions realized in this way have band-edge slopes of 12, 18, or 24 dB/octave for two, three, or four-section filters, respectively. As crossover filter slopes increase, system performance generally improves. Even a 24 db/octave filter slope, however, has been found to still be insufficient in removing all audible sonic degradations caused by out-of-band signals applied to the drivers. Expansion to more than four filter sections in all pole filter designs has been considered impractical, as many components are required. This typically results in both large power losses as well as excessive cost.

A different approach to loudspeaker crossover filter design is necessary for a practical solution to the aforementioned problems. To understand the infinite slope concept introduced by the instant invention, the so-called brick wall amplitude function is first defined. The brick wall function is illustrated in FIG. 4. In a selected range of frequencies 120 (i.e., the passband) between frequencies $f_1$ and $f_2$, the amplitude response is finite and flat, (i.e., a constant value), while at frequencies 122 (below $f_1$) and frequencies 124 above $f_2$, the amplitude response is zero.

Refer now to FIG. 5 where a second brick wall amplitude function is placed alongside the brick wall function of FIG. 4 in order to increase the range of frequencies covered. FIG. 5 shows two adjacent brick wall amplitude functions with respective passbands 126 and 128 spanning audible frequency range, for example between $f_1$=20 Hz and $f_3$=20 KHz; $f_2$ is a typical crossover frequency, i.e., 2 KHz. The composite brick wall function of FIG. 5, therefore, represents the response of a crossover network having a constant frequency response over the entire audio frequency range. If a perfect woofer and a perfect tweeter were connected to such a crossover network, a loudspeaker system having a flat or constant amplitude response could be realized.

FIG. 7 is a schematic diagram of a simple embodiment 130 of the inventor's infinite slope technology, which provides a crossover filter circuit having an effectively- or quasi-infinite band edge (i.e., greater than 40 dB/octave) frequency response, as shown in FIG. 5. Acoustic outputs of woofer 102 and tweeter 104 are therefore separate and distinct due to the effectively infinite slope at $f_2$, (FIG. 5). Acoustic wave interference between woofer 102 and tweeter 104 is rendered ineffective (i.e., the effects of such interference are reduced to a point of inaudibility) because neither driver 102 nor 104 radiates sound energy in frequencies covered by the other. In other words, drivers on adjacent frequency bands, for example tweeter 104 and woofer 102, effectively operate independently of one another. Distortion is reduced because only negligible bass energy enters and overloads the tweeter 104, and only negligible high frequency energy enters woofer 102 to cause cone breakup.

Until the inventor's infinite slope design was introduced, no useful brick wall loudspeaker crossover filter designs existed that used passive components. Classic filter design techniques available before the introduction of infinite slope were not capable of producing a useful device. Early attempts to design such a network relied on crude, brute force, all-pole filter methods having numerous filter stages. A schematic diagram of one such filter is shown in FIG. 6*a*. The circuit of FIG. 6*a* is a low-pass or woofer example and has a useful slope of 96 dB/octave as shown in FIG. 6*b*. A filter built using the design of FIG. 6*a* exhibits high signal losses and requires many, typically expensive, components. While the high signal losses may possibly be tolerated, the component cost renders such a circuit generally impractical.

The present inventor's infinite slope method, as disclosed in U.S. Pat. No. 4,771,466 (included by reference), became the first practical, high-slope loudspeaker crossover filter system using all passive components. The disclosed method achieves a steep slope in crossover filter networks using few passive components. Signal loss is small, typically less than 1 dB, so system efficiency is not compromised. Also, because of the low component count, cost is reasonable.

The two-way (i.e., woofer-tweeter), infinite slope speaker system using the inventor's "infinite slope" technology shown in FIG. 7 has only five components in its crossover filter 130—three capacitors 132 and two transformers 134. To explain how the crossover network 130 works, pole-zero concept is utilized. Typically, filter network transfer functions are mathematically characterized as having "poles" and "zeros," which are the roots of the denominator and numerator polynomials, respectively, of the equation for $f_{(s)}$ (i.e., the transfer function of the crossover network filter). Simply stated, poles indicate output at and near pole frequencies, and zeros indicate no output at or near zero frequencies.

FIG. 8*a* is a schematic diagram, 136, FIG. 8*b* is the positive frequency axis poles and zeros (p-z), and FIG. 8*c* is a typical frequency response plot of a prior art low-pass woofer crossover transfer function. Note that the mirror-image finite p-z on negative frequency axis are not shown. Three zeros are shown at infinity. If, however, a zero could be moved from infinity nearer to the positive frequency pole cluster by simple means, a practical way to increase amplitude function slope would be realized. Note that a mirror image zero would then also move on the negative frequency axis but is not shown. The inventor discovered a new method (i.e., replacing coils $L_1$ 138 and $L_2$ 140 of FIG. 8*a* with a transformer) for accomplishing this zero migration. This invention forms the basis for his U.S. Pat. No. 4,771,466 United States Patent filed in 1987 and included herein by reference.

FIG. 8*d* is a schematic diagram of a simplified circuit utilizing the present inventor's infinite slope technology as described and claimed in U.S. Pat. No. 4,771,466, previously issued to him. For completeness, prior art methods not forming part of the present invention are described in this patent application.

FIG. 8*d* illustrates a circuit resulting from replacing $L_1$ 138 and $L_2$ 140 (FIG. 8*a*) by transformer 142. Note in FIG. 8*e* that a zero has now appeared on the positive frequency axis close to the pole cluster. This zero, once at infinity (FIG. 8*b*), becomes finite (FIG. 8*e*). The transformer 142 (FIG. 8*d*) moved the zero from infinity to a point close to the pole cluster.

Mathematically, a second, finite, mirror image zero appears on the negative frequency axis (not shown) because zeros always move in pairs from infinity to mirror image positions on finite regions of the frequency axis. This "zero-moving" method produces a good (i.e., effective) approximation to a low-pass brick wall amplitude function (FIG. 8*f*). Similar methods exist for band-pass and high-pass infinite slope crossover filters. These methods are described in detail in the inventor's '466 patent.

Respectively shown at 144 and 144' in FIGS. 8*c* and 8*f* are slopes in the amplitude response of the low-pass filters in each respective FIGS. 8*a* and 8*d*. In FIG. 8*c*, the slope 144 in response, resulting from the 3-element low-pass filter (FIG. 8*a*), is 18 dB/octave. In FIG. 8*f*, the slope 144' may be as high as 120 dB/octave in the very best embodiments of the invention, which is generally recognized by those skilled in the art as a good or useful approximation to the brick wall amplitude function.

A mutually coupled coil pair or transformer is one method that may be used to generate transfer function transmission zeros in inventor's novel infinite slope circuit. Equations defining some functions of transformers (e.g., transformer 142) used in accordance with the invention are:

$$K = \frac{M}{(L_1 * L_2)^{\frac{1}{2}}} \tag{6}$$

$$M = \frac{(L11 - L12)}{4} \tag{7}$$

where:

K=coefficient of coupling;

M=mutual inductance of $L_1$, $L_2$;

L1=self-inductance, primary transformer winding;

L2=self-inductance, secondary transformer winding;

L11=total inductance of L1 and L2 when series-connected with magnetic fields aiding;

L22=total inductance of L1 and L2 when series-connected with magnetic fields opposing.

Refer now to FIGS. 14*a* and 14*b*, which illustrate the well known "T" model for a mutually coupled coil pair or transformer. FIG. 14*b* shows a transformer 152 in accordance with the model of FIG. 14*a*. Transmission zeros are generated in accordance with the invention when $L_1$ 146 and $L_2$ 148 are coupled, causing opposing magnetic fields (not shown); mutual inductance M 150 is shown in transformer model.

Let components assume values:

$L_1$=1 millihenry $L_2$=1 millihenry

Then transformer 152 (FIG. 14*b*) is assembled to yield:

$L_{11}$=2.4 millihenry $L_{22}$=1.8 millihenry

This gives M a value of 0.15 millihenry from Equation (7), making K equal to 0.15 from Equation (6). This transformer 152 is incorporated into the loudspeaker system crossover of FIG. 10. Amplitude response 154 (FIG. 11) of a midrange driver has slope 156 of at least 40 dB/octave and, in better embodiments of the present invention, up to 120 db/octave.

In the time since the issuance of his '466 patent, the inventor has considered several factors for improving crossover filter networks. Such factors include optimizing the input impedance characteristic of the filter network, and optimizing "acoustic fill" at crossover frequencies.

Inventor's prior art addresses these factors, but it is difficult to simultaneously optimize the factors given above. A new approach is required. After experimentation, a simple solution was found. The inventor's new method combines inventor's prior art with a series-connected "constant resistance" filter network. Also, requirement for infinite slope cutoff at the lower band-edge of some or all filter networks is relaxed. The present inventor's new art permits a better means for simultaneously optimizing both of the factors listed above. In summary, the method of the present invention is described herein relies on several novel steps.

First, at least one series connected, constant resistance network is added at the input terminals of the crossover filter system. In addition, infinite slope designs are used for the upper (higher frequency) band-edge of low-pass and band-pass filters. Optionally, infinite slope designs may be used in the high-pass filters of the network. Also, infinite slope designs may optionally be used for lower band-edge frequencies of band-pass filters.

DISCUSSION OF THE RELATED ART

Numerous attempts have been made to design and construct crossover networks that meet the criteria the present inventor has identified. Some crossover networks of the prior art have even shown circuitry including mutually coupled inductive devices such as transformers. However, none teach or suggest the novel approaches of the present invention. For example, U.S. Pat. No. 4,138,594 for SMALL DIMENSION LOW FREQUENCY FOLDED EXPONENTIAL HORN LOUDSPEAKER WITH UNITARY SOUND PATH AND LOUDSPEAKER SYSTEM INCLUDING SAME, issued Feb. 6, 1979 to Paul W. Klipsch, includes autotransformers. The KLIPSCH autotransformers are used to adjust voltage levels to the various drivers in the speaker system. The KLIPSCH crossover network does not include any infinite slope filters nor is there any means for providing a substantially constant input impedance as provided by the present invention.

U.S. Pat. No. 4,237,340 for CROSSOVER NETWORK FOR OPTIMIZING EFFICIENCY AND IMPROVING RESPONSE OF LOUDSPEAKER SYSTEM, issued Dec. 2, 1980 to Paul W. Klipsch, is similar to the crossover network of the KLIPSCH '594 discussed hereinabove. As is the case with the '594 crossover network, no infinite slope filters are present, nor is any means for providing a substantially constant input impedance taught.

U.S. Pat. No. 4,287,389 for HIGH-FIDELITY LOUDSPEAKER SYSTEM, issued Sep. 1, 1981 to George W. Gamble, discloses a crossover network wherein the actual loudspeaker drivers are incorporated into a feedback circuit of the amplifier driving the speakers. While inductive elements are shown, the circuit bears no similarity to the design of the present invention.

U.S. Pat. No. 4,606,071 for LOUDSPEAKER CIRCUIT USING AN EQUALIZER CIRCUIT, issued Aug. 12, 1986 to Lahroy A. White, Jr., teaches crossover design. While series L/C/R networks are shown, both their arrangement and function are different from either the crossover filter or impedance equalization portions of the circuit of the present invention.

In U.S. Pat. No. 4,897,879, issued Jan. 30, 1990 to Ronald J. Geluk for MULTI-WAY LOUDSPEAKER SYSTEM, GELUK discloses series-connected constant resistance networks. However, GELUK's constant resistance networks are configured to work with the added transformer. The crossover frequency slopes shown are only 6 dB/octave, significantly different than the infinite slope filter of the present invention.

Further, GELUK appears to abandon the concept of constant impedance in favor of adjusting the "Q" of his crossover network by reducing the ratio of inductance to capacitance. This increases the crossover slope to approximately 12 dB/octave near the band edge. It is believed that this tends to put a loudness peak in amplitude response near the crossover frequency.

To compensate for this phenomenon, GELUK adds a transformer to the circuit to flatten the frequency response while attempting to maintain the 12 dB/octave filter slope. Nothing in GELUK teaches or suggests the approximately 120 dB/octave filter slopes of the infinite slope techniques or the possibility of moving zeros by using a transformer as in the present invention.

U.S. Pat. No. 5,598,480, issued Jan. 28, 1997 to Man H. Kim for MULTIPLE OUTPUT TRANSFORMER NETWORK FOR SOUND REPRODUCING SYSTEM, teaches another crossover network utilizing autotransformers, primarily for establishing sound output levels. Further, the KIM autotransformers allow the use of a low current, high impedance connection to the amplifier driving the loudspeaker system. This is advantageous, particularly when the loudspeaker is located apart from the amplifier as power losses in the intervening cables may be minimized. However, KIM teaches no movement of zeros through the use of autotransformers or any other mutually coupled inductive device. The KIM filter slopes appear to be in the range of 12 dB/octave.

U.S. Pat. No. 5,937,072, issued Aug. 10, 1999 to Christopher E. Combest for AUDIO CROSSOVER CIRCUIT, teaches a crossover network with relatively steep (i.e., approximately 30 dB/octave) filter slopes. The COMBEST circuitry is similar to that disclosed by the instant inventor in his '466 patent. However, COMBEST falls short of true infinite slope filter slopes (i.e., greater than 40 dB/octave and up to 120 dB/octave as defined by the present inventor) and neither teaches nor suggests either the slope relaxation or the impedance control aspects of the instant invention.

No teaching of the prior art taken individually or in any combination is seen to teach or suggest the features of the present invention.

SUMMARY OF THE INVENTION

The present invention provides an improvement to inventor's prior art loudspeaker crossover filter (i.e., infinite slope designs). A substantially flat network input-impedance characteristic across the audible frequency range is provided by the addition of at least one series connected constant-resistance network at the input terminals of the crossover filter system.

By relaxing certain infinite slope filter parameters, more uniform acoustic polar response of the loudspeaker system is obtained. Specifically, infinite slope methods are used for the upper (higher frequency) band-edge of low-pass and band-pass filters, and optionally, for high-pass filters. Infinite slope characteristics, however, are relaxed for the lower frequency slope of band-pass filters and, optionally, for high-pass filters. In addition, the crossover network uses fewer components than infinite slope crossovers of the prior art.

It is therefore an object of the invention to provide a crossover filter network presenting a substantially uniform impedance across the audible frequency range at its input terminals.

It is a further object of the invention to provide a crossover filter network wherein relaxation of the infinite slope for at least one filter band edge amplitude response as taught by the inventor's '466 patent optimizes "acoustic fill" at and near crossover frequencies.

It is another object of the invention to provide a crossover filter network allowing construction of loudspeaker systems that sound good as well as perform well in objective tests.

It is an additional object of the invention to provide a loudspeaker crossover network wherein a mutually coupled inductive device such as a transformer is utilized to move transfer function zeros whereby the polar response (i.e., sound pressure in the acoustic space) of the loudspeaker system is improved.

BRIEF DESCRIPTION OF THE DRAWINGS

A complete understanding of the present invention may be obtained by reference to the accompanying drawings, when considered in conjunction with the detailed description, in which.

is

DETAILED DESCRIPTION OF THE PREFERRED EMBODIMENT

Figure 9A:
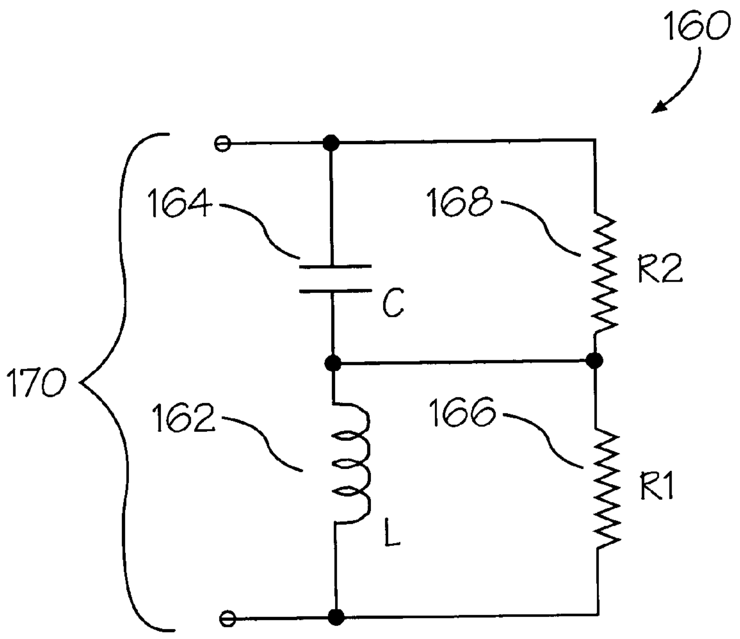
FIG. 9*a* is an electrical schematic diagram of a prototype constant-resistance network.

Referring first to FIG. 9(*a*) there is shown an electrical schematic diagram of a constant resistance network, generally at reference number 160, formed by inductor L 162 and capacitor C 164 combined with resistors $R_1$ 166 and $R_2$ 168. Such a constant resistance, series connected filter is known to those skilled in the electrical design art. The circuit of FIG. 9*a* satisfies the criterion given by:

$$Z_0 = R_1 = R_2 = \left(\frac{L}{C}\right)^{\frac{1}{2}} \tag{8}$$

Where $Z_o$ is input impedance to the circuit, $R_1$, $R_2$ are nominal or design resistance for the circuit, typically 8 ohms in loudspeaker systems, L is inductance (in Henries), and C is capacitance (in Farads).

Textbooks in the art mathematically show that input impedance $Z_o$ at input terminals 170 is equal to the value R ohms (i.e., $R_1$ or $R_2$) for all frequencies when equation (8) is satisfied.

The method of the present invention is realized when resistors $R_1$ 166 and $R_2$ 168 are each replaced by a suitable crossover filter-loudspeaker driver combination. $R_1$ 166 in the preferred embodiment is replaced by a single high-pass filter and tweeter combination, as in so-called two-way woofer-tweeter loudspeaker systems. In alternate embodiments, $R_1$ 166 may be replaced by the single high-pass filter plus one or more band-pass filter and midrange driver combination(s), thereby forming a so-called multi-way loudspeaker system with a woofer, tweeter, and one or more midrange drivers. $R_2$ is replaced in the preferred embodiment by a single low-pass filter and woofer driver combination.

Figure 9B:
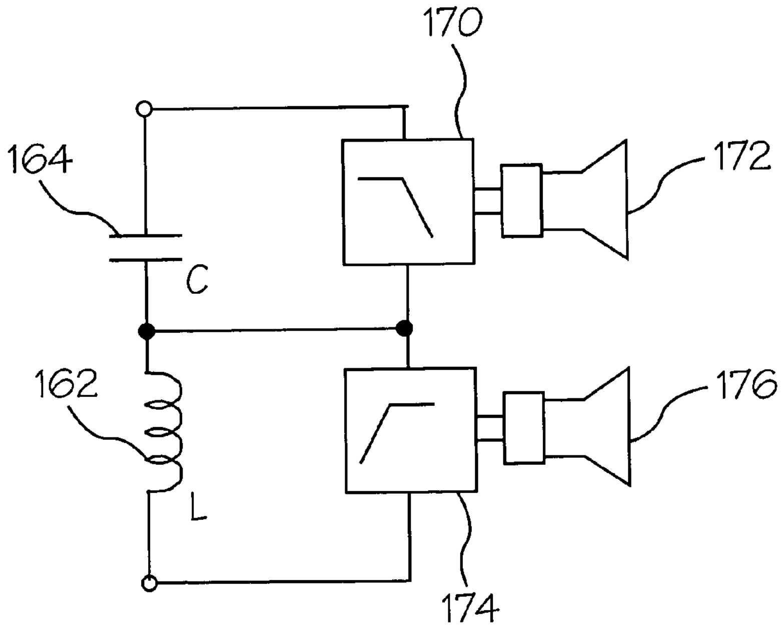
FIG. 9*b* is an electrical schematic diagram wherein a low-pass filter and woofer loudspeaker driver replace resistor $R_2$ and a high-pass filter and tweeter loudspeaker driver replace resistor $R_1$ of the prototype constant-resistance network of FIG. 9*a;*
Figure 9C:
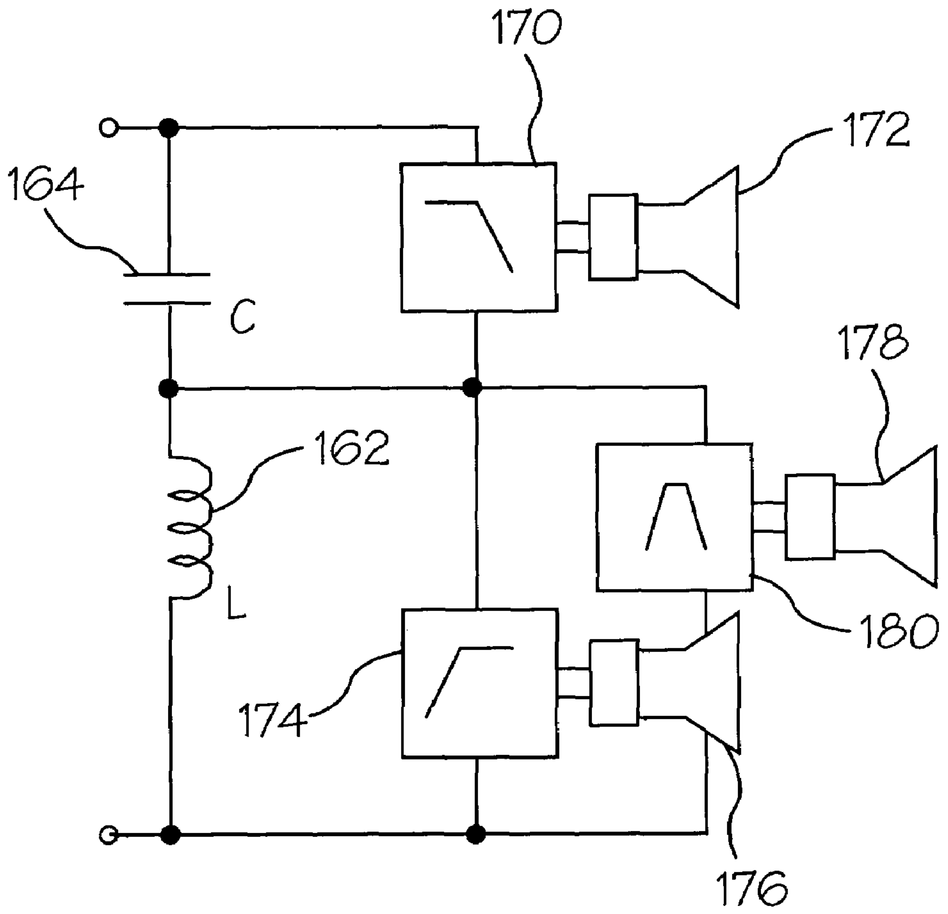
FIG. 9*c* is an electrical schematic diagram of the arrangement of FIG. 9*b* wherein a midrange loudspeaker driver has been added.

FIGS. 9*b* and 9*c* illustrate such two-way and multi-way loudspeaker systems, respectively. In FIG. 9*b*, low-pass filter 170 and woofer loudspeaker driver 172 replace $R_2$ 168 of the prototype constant resistance network of FIG. 9*a*. Similarly, high-pass filter 174 and tweeter loudspeaker driver 176 replace resistor $R_1$.

FIG. 9(*c*) illustrates an alternate embodiment where a midrange loudspeaker driver 178 is added. Woofer filter 170 and driver 172 are identical to corresponding filter 170 and driver 172 of FIG. 9*b*. Band-pass filter 180 and midrange driver 178 and high-pass filter 174 and tweeter driver 176 replace resistor $R_1$. It will be recognized that multiple tweeter driver units 176 and/or mid-range drivers 178 could be selected to meet a particular operating circumstance or environment. Consequently, the invention is not considered limited to the particular configurations chosen for purposes of disclosure.

Figure 10:
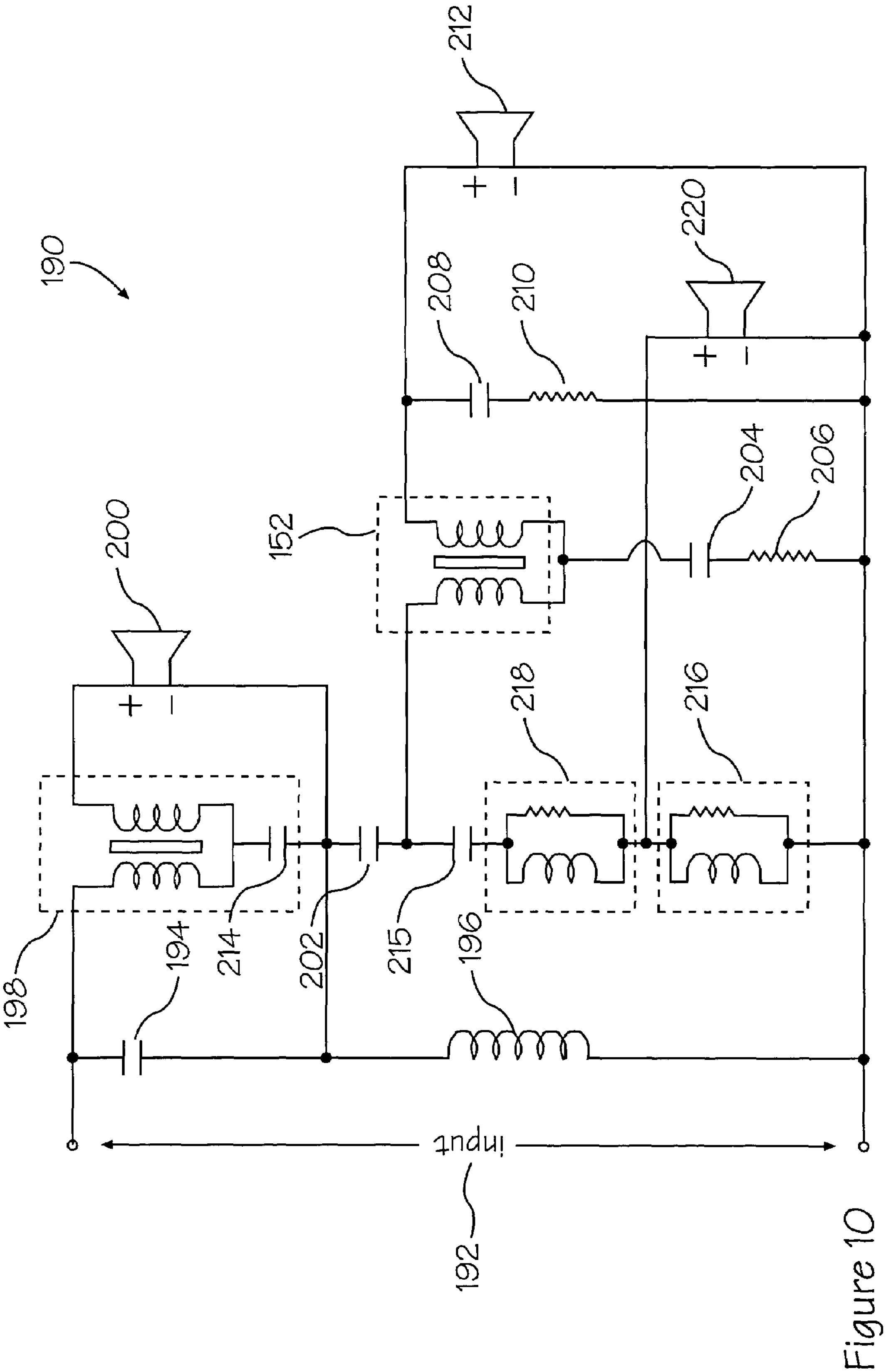
FIG. 10 is an electrical schematic diagram of a three-way loudspeaker system (woofer, midrange, tweeter) utilizing the modified infinite slope technology as well as input impedance control and crossover fill techniques of the invention.

Referring now to FIG. 10, there is shown a schematic diagram of a three-way loudspeaker system (woofer, midrange, tweeter) utilizing the inventive technology, generally at reference number 190. The loudspeaker has a pair of input terminals 192 adapted to be connected to an electrical audio signal source (not shown). A capacitor C 194 and an inductor L 196 are connected in series across input terminals 192. Capacitor 194 and inductor 196 respectively correspond to capacitor 164 and inductor 162 of FIG. 9*a*.

In the embodiment shown in FIG. 10, $R_2$ 168 (FIG. 9) is replaced by low-pass filter 198 and woofer driver 200. Low (i.e., bass) frequencies are reproduced by woofer 200 in combination with filter 198. Similarly, resistor $R_1$ 166 (FIG. 9) is replaced by a band-pass filter consisting of capacitor 202, transformer 152, capacitor 204 and resistor 206, an impedance-correction circuit formed by capacitor 208 and resistor 210, and mid-range driver 212. This combination functions to reproduce middle frequencies of the audio spectrum. Finally, a high-pass filter circuit formed by capacitor 215, an inductor-resistor network 216, an impedance correction circuit formed by inductor-resistor network 218, and tweeter 220 all serve to reproduce high frequencies.

In any of the embodiments chosen for purposes of disclosure, parameter values for resistors, capacitors, inductors, transformers, and loudspeaker drivers are chosen such that the nominal input impedance of each respective crossover filter/loudspeaker combination is equal to the ohmic value of the resistor in the constant resistance prototype of FIG. 9. Impedance-correction circuits are used, when necessary, in some crossover filters to insure that the input impedance of the respective filter/driver combination accurately matches the ohmic value of the resistor of the prototype constant resistance network.

In accordance with the present invention, infinite slope frequency response is provided in the low-pass filter by transformer 198 and capacitor 214, connected to woofer driver 200. In a similar manner, infinite slope frequency response is provided in the low-pass slope of the band-pass filter by transformer 152, capacitor 204, and resistor 206, and the mid-range filter is connected to midrange driver 212.

Figure 11:
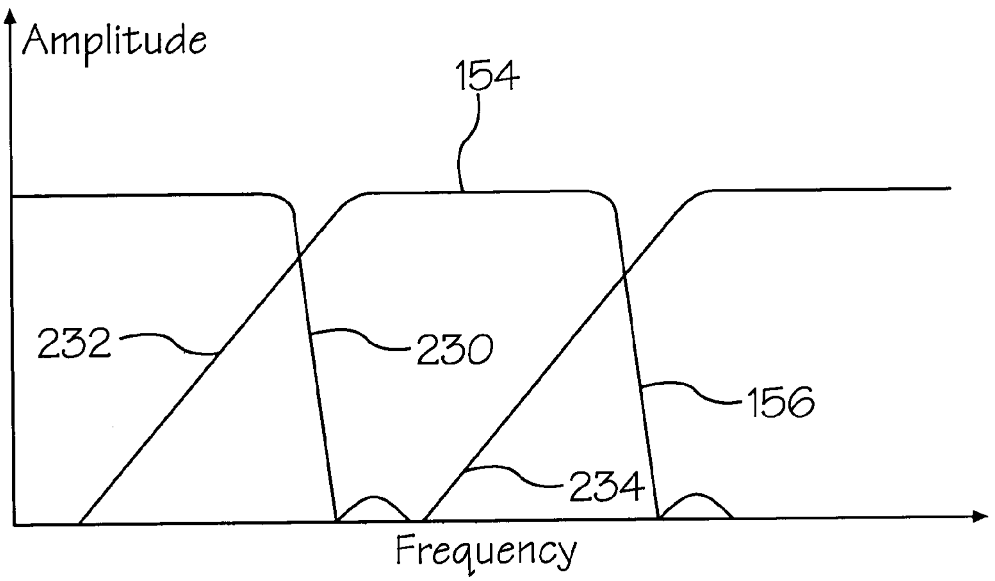
FIG. 11 is an amplitude-frequency (i.e., frequency response) plot of measurements taken on a loudspeaker system built in accordance with the circuit of FIG. 10.

Frequency response measurements taken on a loudspeaker system built in accordance with the circuit of FIG. 10 are shown in FIG. 11. The desired high slopes in the upper band edge of frequency response are shown at reference number 230 and 156 for the woofer 200 and midrange driver 212, respectively. It may be readily observed that the low slopes 232, 234 are significantly lower as is also desired.

As stated above, the use of infinite slope filters in a crossover network alone has been found by the present inventor to be insufficient to provide optimum sound reproduction in a loudspeaker system. The additional factors necessary to provide optimum reproduction also include optimizing the input impedance characteristic for the crossover filter network as well as optimizing the "acoustic fill" at crossover frequencies. The loudspeaker system shown in FIG. 10 accomplishes both of these objectives.

Obtaining optimum input impedance in a loudspeaker system built in accordance with the inventor's teaching (i.e., U.S. Pat. No. 4,771,466) is difficult. The problem lies in the particular arrangement of crossover filter/driver combinations used in the inventor's earlier prior art loudspeaker systems. In such systems, all crossover filter/driver combinations are typically connected electrically in parallel.

Figure 1:
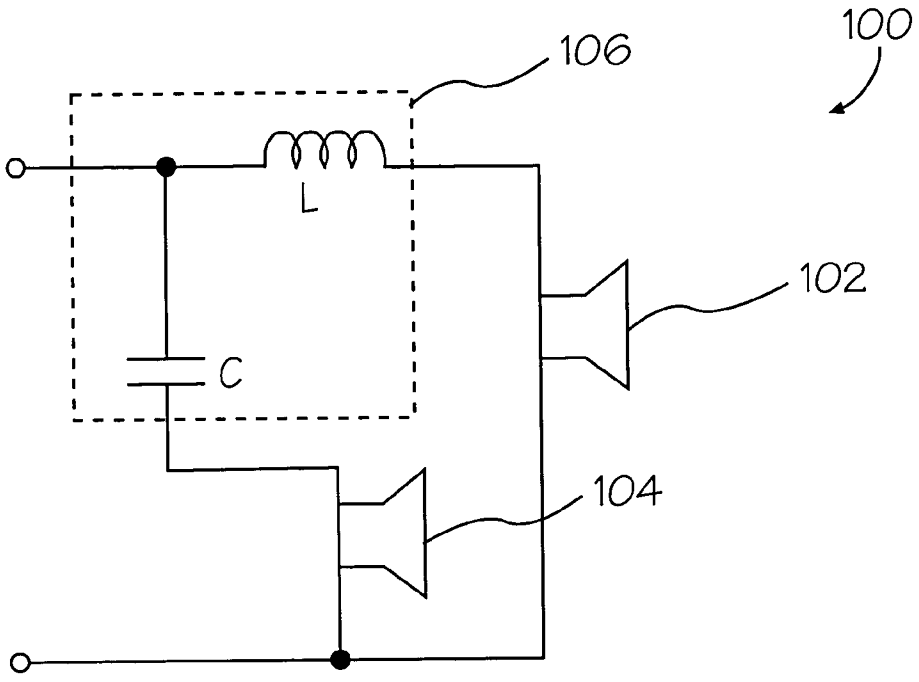
FIG. 1 is a schematic diagram of a simple, two-driver loudspeaker system having a simple L-C crossover network.
Figure 2:
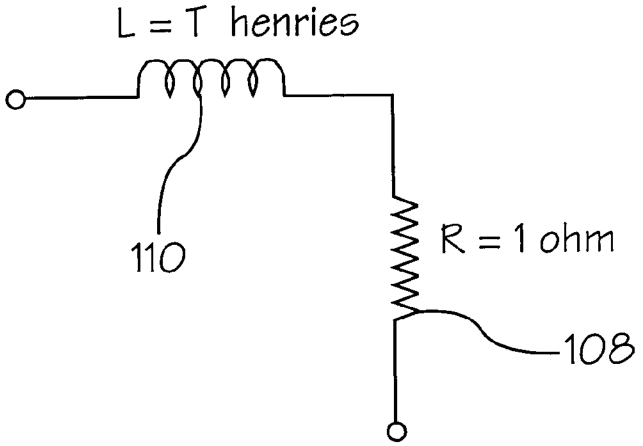
FIG. 2 is a schematic diagram of an electrical equivalent circuit of the inductor/driver portion of FIG. 1.
Figure 3:
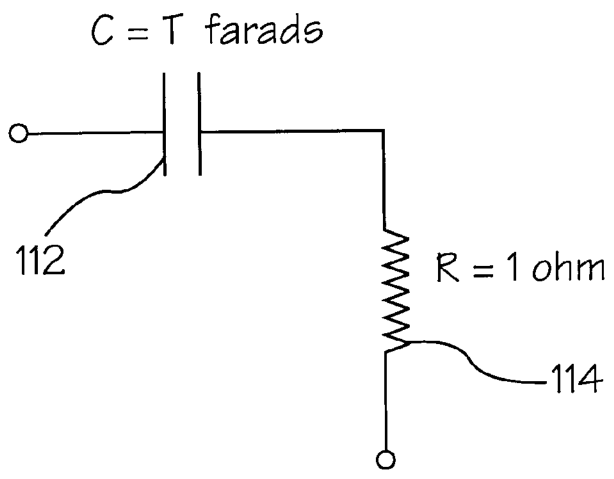
FIG. 3 is a schematic diagram of an electrical equivalent circuit of the capacitor/driver portion of FIG. 1.
Figure 4:
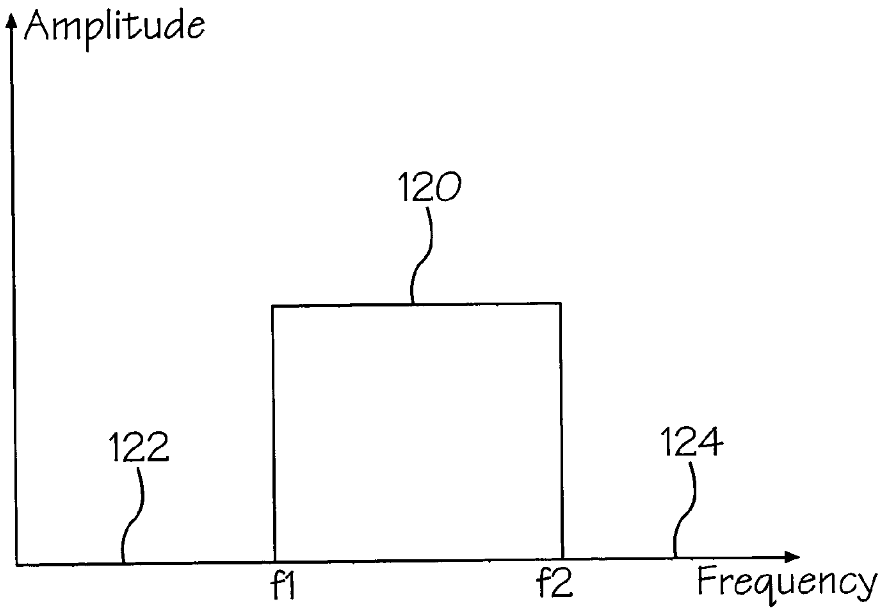
FIG. 4 is an amplitude-frequency plot of a brick wall function.
Figure 5:
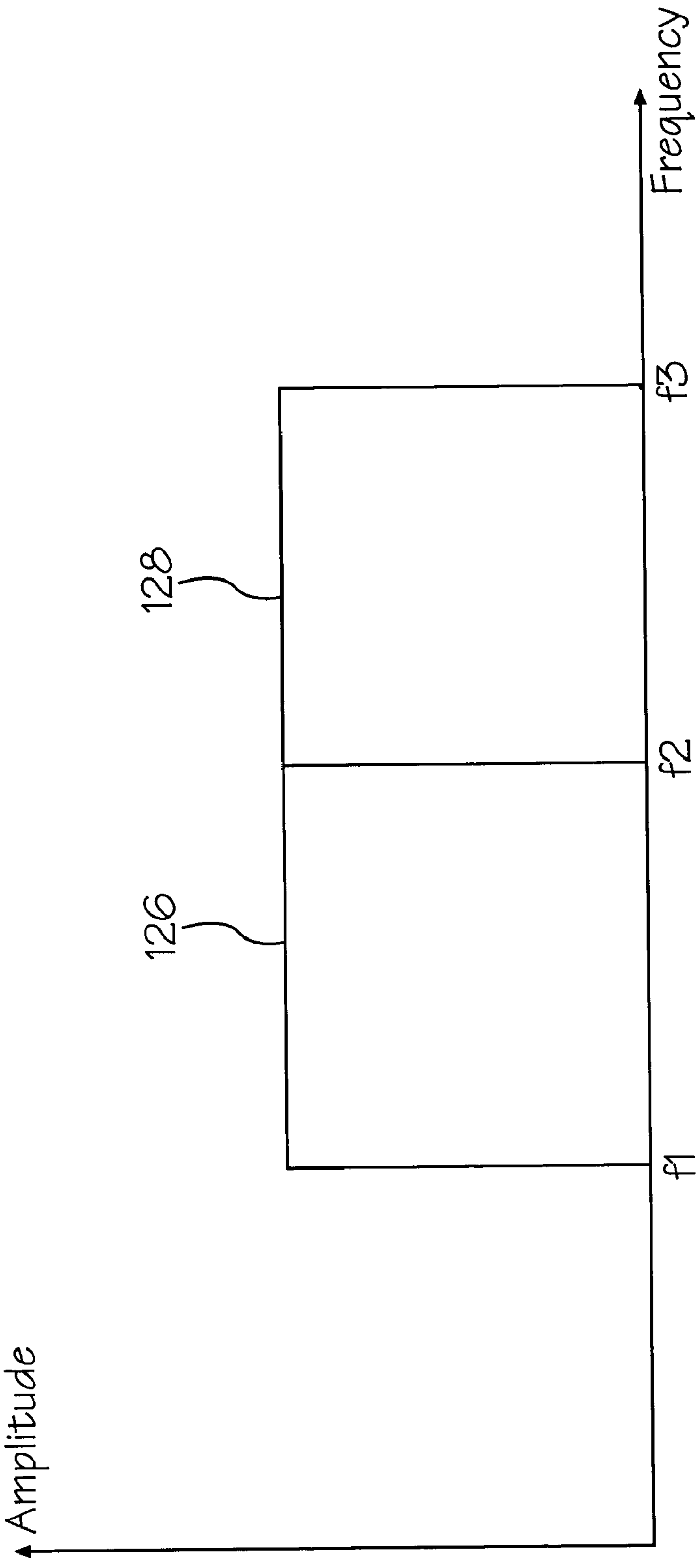
FIG. 5 is an amplitude-frequency plot of a pair of adjacent brick wall functions.
Figure 6A:
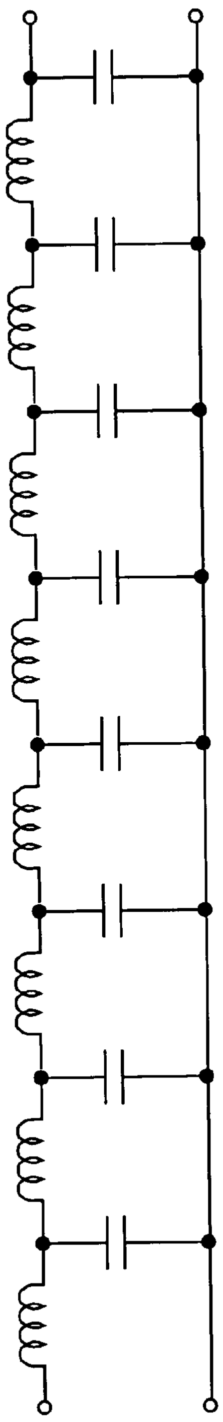
FIG. 6*a* is an electrical schematic diagram of an eight section low-pass filter of a classic design and having a 96 dB/octave slope.
Figure 6B:
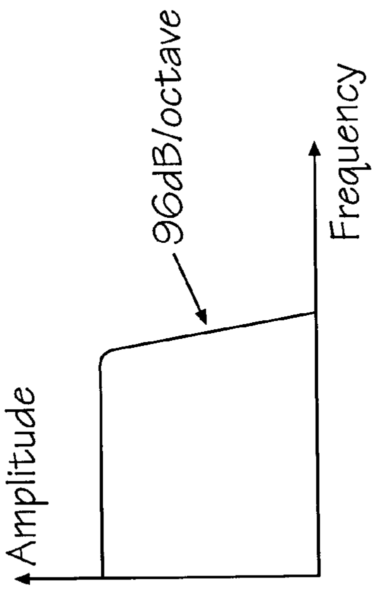
FIG. 6*b* is an amplitude-frequency plot of the filter of FIG. 6*a;*
Figure 7:
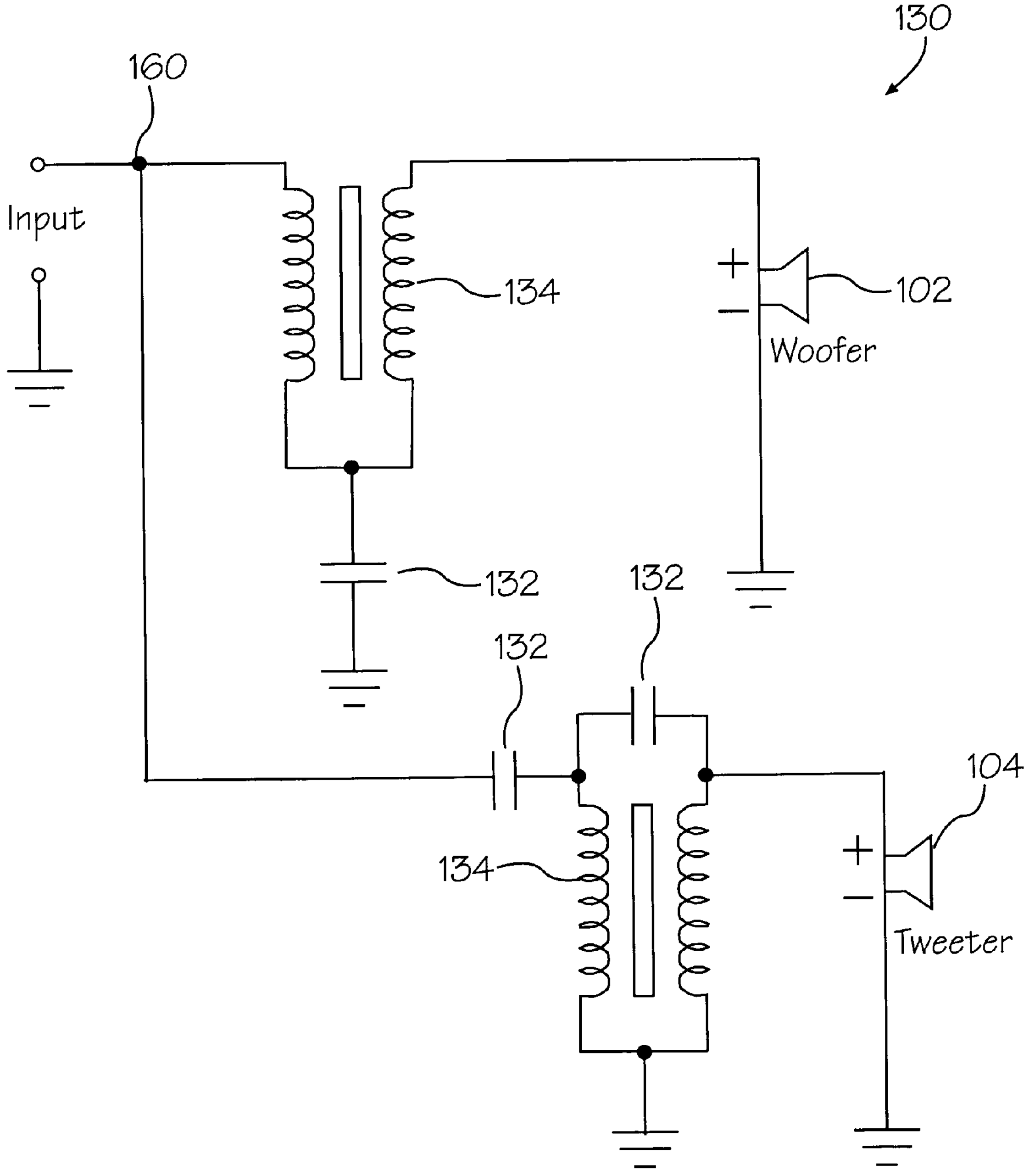
FIG. 7 is a simplified electrical schematic diagram of a two-driver loudspeaker system utilizing a crossover network using an infinite slope design.
Figure 8A:
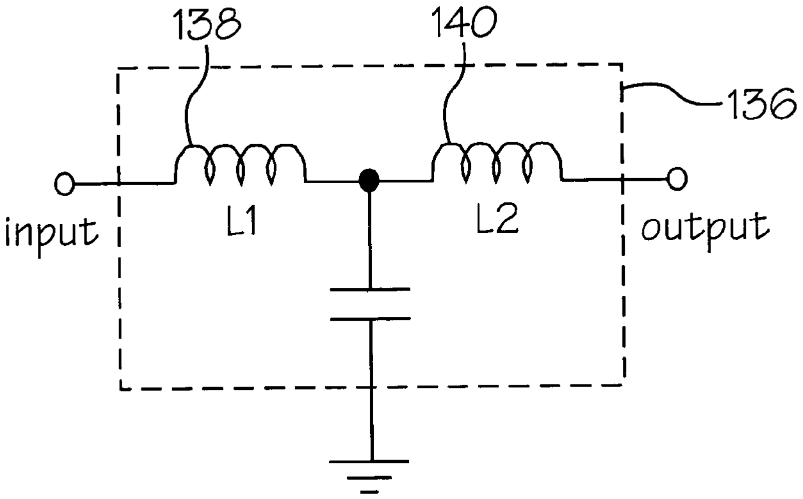
FIG. 8*a* is an electrical schematic diagram of a two-inductor low-pass filter.
Figure 8B:
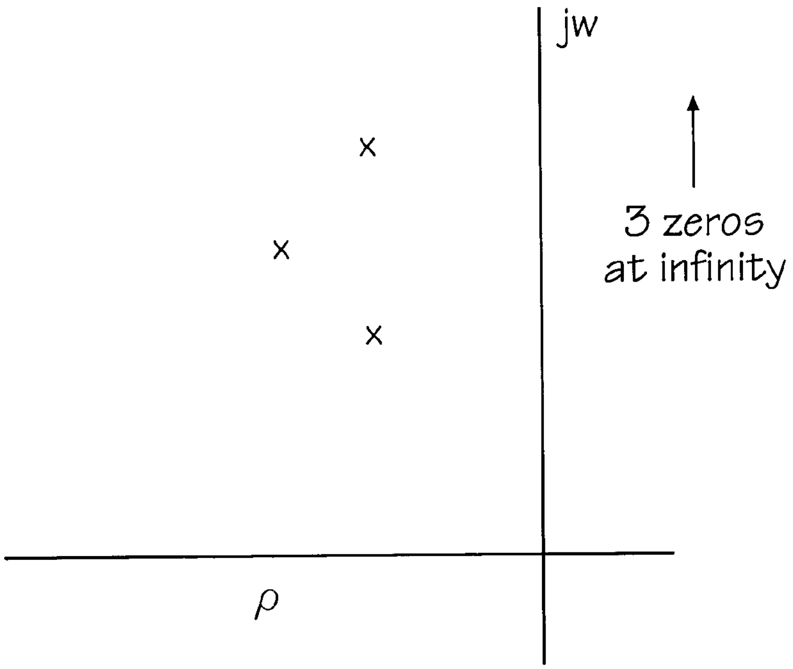
FIG. 8*b* is a pole-zero (p-z) plot of the filter of FIG. 8*a;*
Figure 8C:
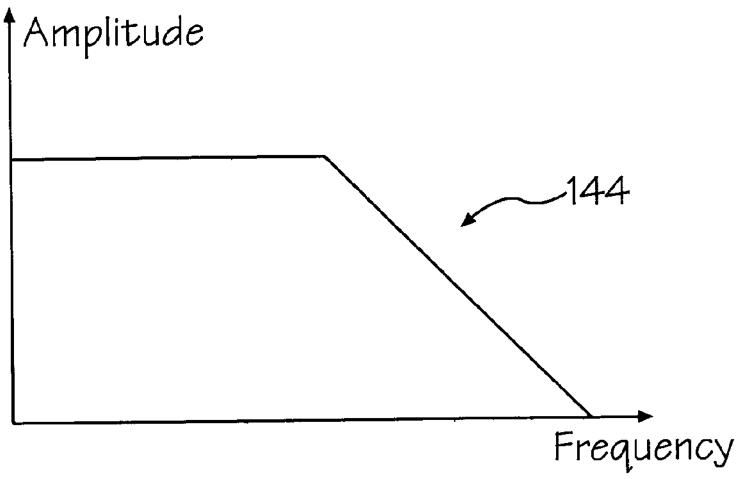
FIG. 8*c* is an amplitude-frequency plot of the filter of FIG. 8*a;*
Figure 8D:
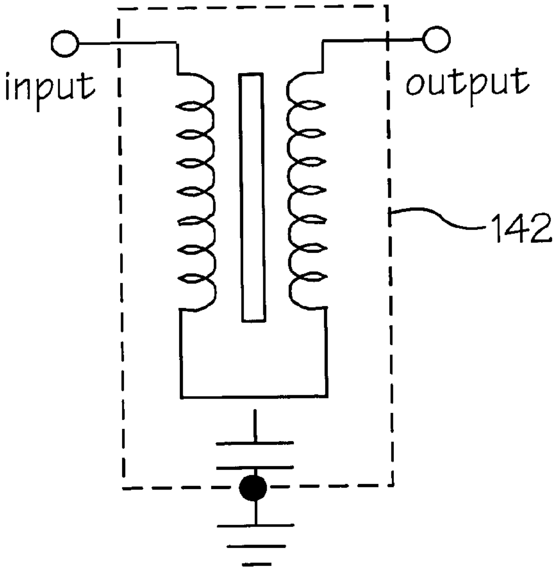
FIG. 8*d* is an electrical schematic diagram of an infinite slope replacement for the two-inductor low-pass filter design of FIG. 8*a;*
Figure 8E:
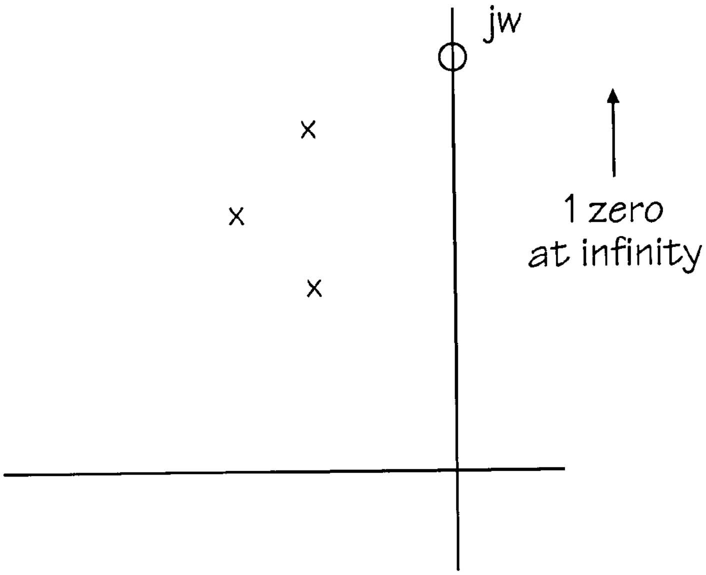
FIG. 8*e* is a pole-zero (p-z) plot of the filter of FIG. 8*d;*
Figure 8F:
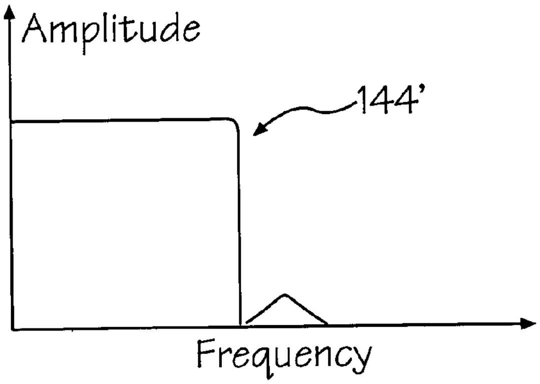
FIG. 8*f* is an amplitude-frequency plot of the filter of FIG. 8*d;*

FIG. 7 shows a typical system representative of this parallel interconnection topology. It may be readily observed that both filters, low-pass for woofer 102 and high-pass for tweeter 104, connect to a common input terminal shown at reference number 160. Because of this parallel interconnection arrangement, the input impedance of each filter/driver combination interactively affects one another.

It is generally understood by those skilled in the art that the input impedance of a filter network can be made substantially resistive in the filter passband. However, the input impedance becomes reactive and has a large phase angle in the filter stop band.

In the loudspeaker system shown in FIG. 7, the woofer low-pass will have a good approximation to resistive input impedance in its passband. The low-pass filter, however, shares a common electrical connection with the tweeter high-pass filter, which has a highly reactive input impedance in its stop band. By definition, the passband of the low-pass filter and the stop band of the high-pass filter are substantially identical. Consequently, the reactive input impedance of the high-pass affects the low-pass filter. Similarly, the reactive input impedance of the woofer low-pass filter in the tweeter passband frequency region affects the largely resistive input impedance of the tweeter filter in this same frequency region.

This problem may be overcome by adjusting crossover filter network parameters such that out-of-band phase angles, typically positive or inductive for low-pass filters and negative or capacitive for high-pass filters, cancel each other resulting in an approximate resistive input impedance. Although inventor's prior art provided a solution to the impedance problem, a superior solution is provided by the approach of the present invention.

The improvement to input impedance provided by the approach of the present invention results from the isolation between low and high frequency filters provided in accordance with the constant resistance prototype shown in FIG. 9. This constant resistance network topology, and the resultant series-connection of low and high-pass filters, yields a further degree of freedom in adjusting system parameters, thereby allowing the desired improvement to system input impedance. This improvement is confirmed by experimental measurements on inventor's prior art loudspeaker systems and loudspeaker systems built in accordance with the teaching of the present invention.

Figure 12:
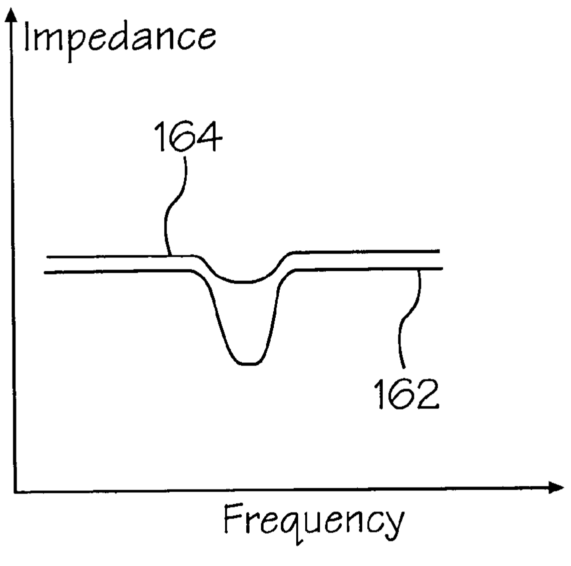
FIG. 12 is an impedance-frequency plot for both prior art loudspeaker systems and loudspeaker systems in accordance with the present invention.

Referring now to FIG. 12, graphs are shown of impedance versus frequency for both prior art loudspeaker systems (lower graph) and loudspeaker systems in accordance with the inventive approach (upper graph). As may readily be observed, a significant dip 162 in input impedance occurs in speakers of the prior art. However, using the input impedance controlling techniques of the present invention, no significant dip in input impedance is seen in region 164.

When prior art system parameters are adjusted for best frequency response, a dip in input impedance typically appears. If circuit parameters are adjusted to control or minimize the impedance dip, optimum frequency response in the crossover frequency region is lost. In other words, infinite slope teaching of the prior art cannot simultaneously satisfy optimum input impedance and frequency response criteria.

The present invention eliminates the necessity for compromise, allowing both impedance and frequency response characteristics to be independently optimized. The improved input impedance (i.e., the curve reference no. 164) of FIG. 12 is realized using the inventive techniques even when circuit parameters have also been optimized for best (i.e., flattest) frequency response in the crossover frequency regions.

Figure 13A:
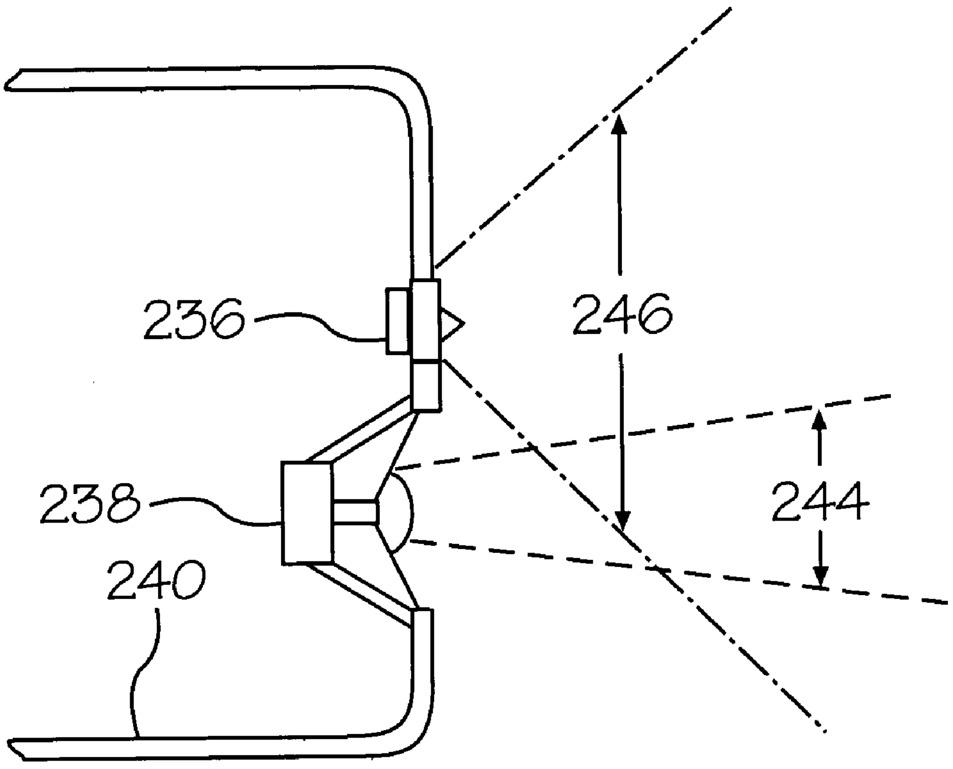
FIG. 13*a* is a schematic diagram showing dispersion patterns of a typical woofer and a typical tweeter.

The second factor deemed necessary for optimum performance of a loudspeaker system is acoustic fill at the crossover frequencies. Acoustic fill refers to how a loudspeaker system radiates sonic energy in the crossover frequency region(s) from its multiple drivers, for example, woofer, tweeter, and midrange, if used. FIG. 13*a* illustrates a simple two-way loudspeaker system. A woofer 238 and a tweeter 236 are mounted on a baffle plate 240 assumed to form part of an infinite baffle.

Figure 13B:
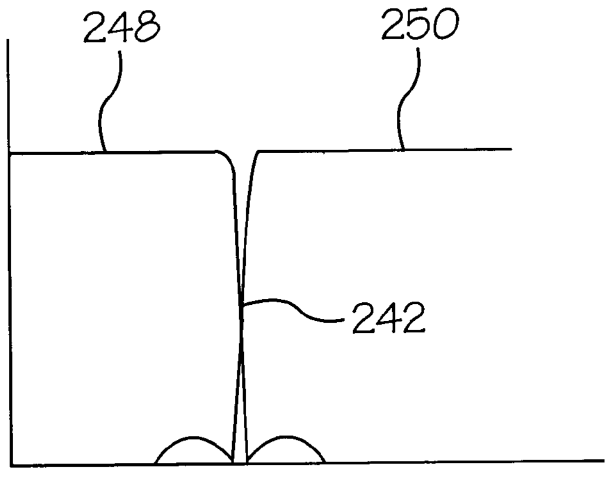
FIG. 13*b* is a frequency response plot for the loudspeaker system of FIG. 13*a* using the infinite slope techniques of the prior art.
Figure 13C:
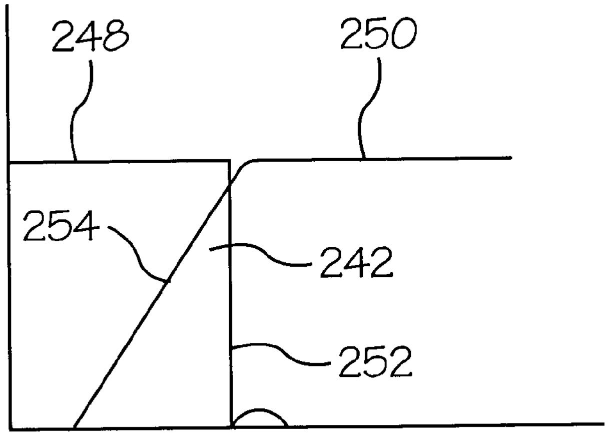
FIG. 13*c* is a frequency response plot for the loudspeaker system of FIG. 13*a* using the modified (i.e., relaxed) infinite slope techniques of the prior art.
Figure 14A:
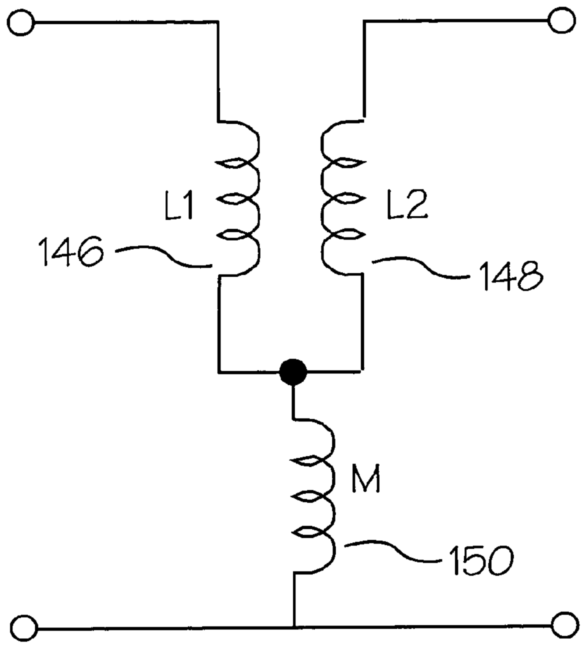
FIG. 14*a* is an electrical schematic diagram of the well known "T" model for a mutually-coupled coil pair or transformer.
Figure 14B:
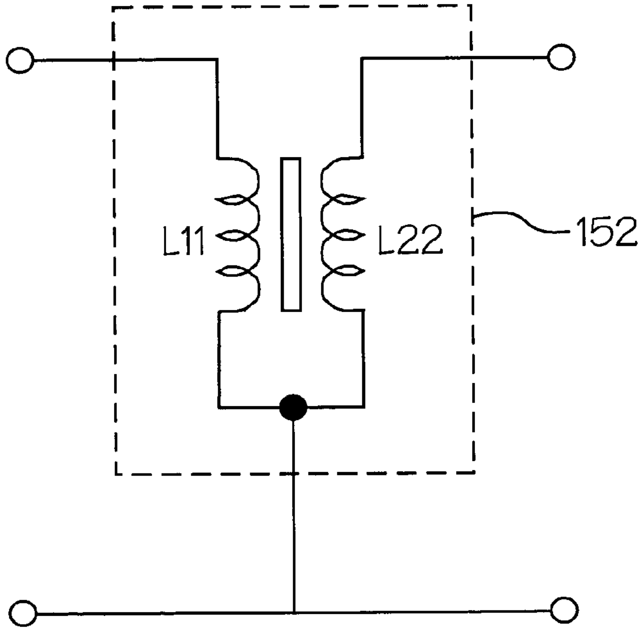
FIG. 14*b* shows a transformer in accordance with the model of FIG. 14*a*.

Refer now to FIGS. 13*b* and 13*c*. Near the crossover frequency, typically 2 KHz, shown at 242 in FIG. 13*b*, both woofer 238 and tweeter 236 radiate sound simultaneously.

Woofer 238, which has a diaphragm of typically 6" to 8" diameter, typically radiates acoustic energy in a narrow beam 244. Tweeter 236 has a much smaller diaphragm, typically ¾" to 1" diameter, and radiates acoustic energy in a wider beam, shown at 246.

An example should clarify the nature of the problem resulting from the difference in radiation patterns from the woofer 238 and the tweeter 236. Assume that the loudspeaker system of FIG. 13*a* used the present inventor's infinite slope prior art technique. The loudspeaker frequency (assuming ideal woofer and tweeter drivers) would appear as shown in FIG. 13*b*. If the loudspeaker system is assumed to be reproducing sound from a musical instrument, a violin, for example, wherein a musical scale is ascending such that sound begins primarily in the woofer 236, frequency region 248 passes through the crossover frequency region 242 and enters the tweeter region 250. Acoustic energy as projected into the space in which the speaker system is sounding will change from the woofer's narrow beam to the tweeter's wide beam. This effect is audible and spoils the accuracy of sound reproduction.

The present invention overcomes the sonic inaccuracy of the prior art by relaxing the slope specification for so-called infinite slope response, where applicable, for one driver at crossover frequency. A loudspeaker frequency response plot for the system with the relaxed specification is shown in FIG. 13*c*. Here the response of the woofer 238 is shown to have an infinite slope low-pass cutoff at 252 but the tweeter 236 response is relaxed, having a less steep cutoff shown at 254. This technique introduces a deliberate error in system amplitude and power response due to the different slopes in the overlap region shown as shaded region 254 in FIG. 13*c*.

The instant inventor has ascertained, however, that introduction of such a deliberate error (i.e., relaxing one of the crossover filter slopes) becomes a sonic asset rather than a liability. Listening tests done on loudspeaker systems using this inventive technique have revealed that errors in sound pressure and/or sound power in crossover frequency regions were less audible than errors arising from sound radiation from different diaphragm sizes of drivers sharing a crossover frequency. Careful design reveals that errors in sound pressure and power caused by relaxing passband slope on one driver can be reduced to inaudibility.

In addition, it has been found that when one driver, generally that with the smaller diaphragm, is connected to the slow (i.e., non-infinite) slope crossover filter, it acoustically covers or masks the effect of the differing radiation patterns. Because one driver 252 (for example, the woofer whose response is shown at 248) has a crossover filter with infinite slope, improvements in system performance due to lowered wave interference and reduced distortion, are realized.

Component Values in One Preferred Invention Embodiment

FIG. 10 is a schematic diagram of a loudspeaker crossover using the techniques of the instant invention. The circuit of FIG. 10 is similar to a crossover filter used in loudspeaker system model "PEARL" manufactured by Joseph Audio of Melville, N.Y. By way of illustration and not limitation, the approximate component values used in the aforementioned crossover filter network areas are as follows:

Capacitor 194: 160 microfarads
Coil 196: 8.3 millihenries
Transformer 198: L1=L2=15 millihenries, k=0.2
Capacitor 214: 66 microfarads
Capacitor 202: 160 microfarads
Transformer 152: L1=L2=1 millihenry, k=0.15
Capacitor 215: 4.8 microfarads
L-R network 218: R=5 ohms, L=0.25 millihenry
L-R network 216: R=15 ohms, L=0.45 millihenry
Capacitor 204: 15 microfarads
Resistor 206: 2 ohms
Capacitor 208: 20 microfarads
Resistor 210: 5 ohms
Loudspeaker 200: SEAS L21RN4X/P
Loudspeaker 212: SEAS W17E002
Loudspeaker 220: SEAS T25CF002-06

The present invention described herein consists of two separate stages of creativity, namely the inventor's infinite slope technology of the prior art, and the modification of the prior art by one or more of the techniques:

1) the addition of at least one series connected constant resistance network at the input terminals of the crossover filter system;

2) the use of infinite slope methods for the upper (higher frequency) band-edge of low-pass and band-pass filters, and optional use of infinite slope method for high-pass filters; and 3) the optional use of infinite slope filter means for lower band-edge frequencies of band-pass filters.

The methods of the instant invention have made possible loudspeaker systems that are improved compared to loudspeaker systems built in accordance with only the infinite slope technology of the prior art. The improvements are found primarily in the system input impedance characteristic and accuracy of loudspeaker system sound reproduction.

Since other modifications and changes varied to fit particular operating requirements and environments will be apparent to those skilled in the art, the invention is not considered limited to the examples chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A crossover network for a loudspeaker system comprising: a low-frequency driver (woofer) and a high-frequency driver (tweeter), comprising:

a) a low-pass filter having a low-pass filter frequency response operatively connected to a signal input and to said woofer for providing substantially only low-frequency signals thereto, said low-pass filter comprising a pair of mutually-coupled coils so as to generate a transmission zero in said low-pass filter frequency response so as to produce an upper frequency slope that is greater than or equal to 120 dB/octave; and b) a high-pass filter operatively connected to said signal input and to said tweeter, said high-pass filter having a lower frequency slope less than 120 dB/octave.

2. The crossover network for a loudspeaker system comprising a woofer and a tweeter as recited in claim 1, wherein said low-pass filter and said high-pass filter are operatively connected to said signal input in a series arrangement.

3. The crossover network for a loudspeaker system comprising a woofer and a tweeter as recited in claim 2, further comprising a least one constant resistance network operatively connected to at least one of said low-pass filter and said high-pass filter and having a topology comprising a parallel R-C combination series connected to a parallel R-L combination and wherein a first of said resistive elements R is replaced by at least one of said low-pass filter and the woofer loudspeaker driver associated therewith, and a second of said resistive elements R is replaced by at least one of said high-pass filter and the tweeter loudspeaker driver associated therewith so that said crossover network presents a substantially constant impedance at said signal input across a predetermined frequency range.

4. The crossover network for a loudspeaker system comprising a woofer and a tweeter as recited in claim 2, wherein said predetermined frequency range comprises a range of frequencies of between approximately 20 Hz and 20 KHz.

5. The crossover network for a loudspeaker system as recited in claim 1, wherein said loudspeaker system further comprises a mid-range driver, said crossover network further comprising:

c) a mid-range band-pass filter operatively connected to said signal input and to said mid-range driver, said mid-range band-pass filter having an effectively infinite upper frequency slope and a relatively shallow lower frequency slope.

6. The crossover network for a loudspeaker system comprising a woofer and a tweeter as recited in claim 5, further comprising a constant resistance network operatively connected to at least one of said low-pass filter, said band-pass filter, and said high-pass filter so that said crossover network presents a substantially constant impedance at said signal input across a predetermined frequency range.

7. In a multi-driver loudspeaker system comprising at least a woofer, a tweeter, and a crossover network operatively connected to each thereof, said crossover network comprising a low-pass filter having a low-pass filter frequency response, comprising a pair of mutually-coupled coils so as to generate a transmission zero in said low-pass filter frequency response and an upper frequency slope that is greater than or equal to 120 dB/octave, said low-pass filter being operatively connected to said woofer, and a high-pass filter also having slope characteristics greater than or equal to 120 dB/octave at both its upper and lower frequency slopes and operatively connected to said tweeter, the improvement comprising:

relaxing said slope characteristic of said lower frequency slope of said high-pass filter to a lower frequency slope of less than 120 dB/octave.

8. The multi-driver loudspeaker system as recited in claim 7, the improvement further comprising:

operatively connecting at least one constant resistance network to a signal input of said crossover network, whereby said multi-driver loudspeaker system presents a substantially constant impedance across a range of frequencies of approximately 20 Hz to 20 KHz at said signal input.

9. The multi-driver loudspeaker system as recited in claim 7, wherein said multi-driver loudspeaker system further comprises a mid-range driver and said crossover network further comprises a band-pass filter operatively connected to said mid-range driver, the improvement further comprising relaxing said slope characteristic of said lower frequency slope of said band-pass filter to a lower frequency slope of less than 120 db/octave.

10. The multi-driver loudspeaker system as recited in claim 9, the improvement further comprising:

operatively connecting at least one constant resistance network to a signal input of said crossover network, whereby said multi-driver loudspeaker system presents a substantially constant impedance across a range of frequencies of approximately 20 Hz to 20 KHz at said signal input.

11. The crossover network for a loudspeaker system comprising a woofer and a tweeter as recited in claim 1, wherein said mutually-coupled coils comprise a transformer.

* * * * *

UNITED STATES PATENT AND TRADEMARK OFFICE
CERTIFICATE OF CORRECTION

PATENT NO. : 7,085,389 B1
APPLICATION NO. : 10/677160
DATED : August 1, 2006
INVENTOR(S) : Richard T. Modafferi It is certified that error appears in the above-identified patent and that said Letters Patent is hereby corrected as shown below:

Column 1, line 47:
Equation should read:
--$S = \sigma + j\omega$--

Column 5, Equation 7:
"$L_{12}$" should be --$L_{22}$--

Column 10, line 29:
"low pass" should be --high pass--

Column 12, line 32:
"low pass" should be --high pass--

Signed and Sealed this

Twenty-eighth Day of November, 2006

JON W. DUDAS
*Director of the United States Patent and Trademark Office*